United States Patent
Lim et al.

(10) Patent No.: US 8,122,186 B2
(45) Date of Patent: Feb. 21, 2012

(54) MEMORY DEVICE, MEMORY SYSTEM AND DUAL PORT MEMORY DEVICE WITH SELF-COPY FUNCTION

(75) Inventors: Young-Hun Lim, Gyeonggi-do (KR); Ji-Tae Ha, Seoul (KR); Ho-Jong Park, Gyeonggi-do (KR)

(73) Assignee: Mtekvision Co., Ltd., Seoul (KR)

( * ) Notice: Subject to any disclaimer, the term of this patent is extended or adjusted under 35 U.S.C. 154(b) by 401 days.

(21) Appl. No.: 12/515,697

(22) PCT Filed: Nov. 21, 2007

(86) PCT No.: PCT/KR2007/005885
§ 371 (c)(1),
(2), (4) Date: May 20, 2009

(87) PCT Pub. No.: WO2008/063010
PCT Pub. Date: May 29, 2008

(65) Prior Publication Data
US 2010/0037014 A1     Feb. 11, 2010

(30) Foreign Application Priority Data
Nov. 21, 2006  (KR) .................. 10-2006-0115519

(51) Int. Cl.
*G06F 13/00*    (2006.01)
(52) U.S. Cl. .................. 711/105; 711/161; 711/162
(58) Field of Classification Search ............... 711/105, 711/161, 162
See application file for complete search history.

(56) References Cited

U.S. PATENT DOCUMENTS

| | | | | |
|---|---|---|---|---|
| 6,260,124 | B1 * | 7/2001 | Crockett et al. | 711/162 |
| 6,397,308 | B1 * | 5/2002 | Ofek et al. | 711/162 |
| 6,446,175 | B1 * | 9/2002 | West et al. | 711/162 |
| 6,487,645 | B1 * | 11/2002 | Clark et al. | 711/162 |
| 6,643,671 | B2 * | 11/2003 | Milillo et al. | 711/162 |
| 6,721,862 | B2 * | 4/2004 | Grant et al. | 711/162 |
| 6,732,244 | B2 * | 5/2004 | Ashton et al. | 711/162 |
| 7,461,221 | B2 * | 12/2008 | Palapudi | 711/162 |
| 2004/0064635 | A1 | 4/2004 | Jung et al. | |
| 2007/0016739 | A1 | 1/2007 | Na | |

FOREIGN PATENT DOCUMENTS

| | | |
|---|---|---|
| JP | 10-161938 A | 6/1998 |
| KR | 94-13351 U | 6/1994 |
| KR | 10-2006-0036654 A | 5/2006 |

* cited by examiner

*Primary Examiner* — Trong Phan
(74) *Attorney, Agent, or Firm* — Birch, Stewart, Kolasch & Birch, LLP (57) ABSTRACT

A memory device with a self-copy function includes a memory cell array having first and second banks, and a memory interface. The memory interface reads data from a memory area of the first bank corresponding to a source address contained in previously set self-copy information and writes the read data to a memory area of the second bank corresponding to a destination address contained in the self-copy information via a self-copy data path when a self-copy signal is activated by an external self-copy start request.

20 Claims, 8 Drawing Sheets

MEMORY DEVICE, MEMORY SYSTEM AND DUAL PORT MEMORY DEVICE WITH SELF-COPY FUNCTION

TECHNICAL FIELD

The present invention relates to a memory device, a memory system and a dual-port memory device, and more particularly, to a memory device, a memory system and a dual-port memory device capable of improving operation performance of a processor.

BACKGROUND ART

Figure 1:
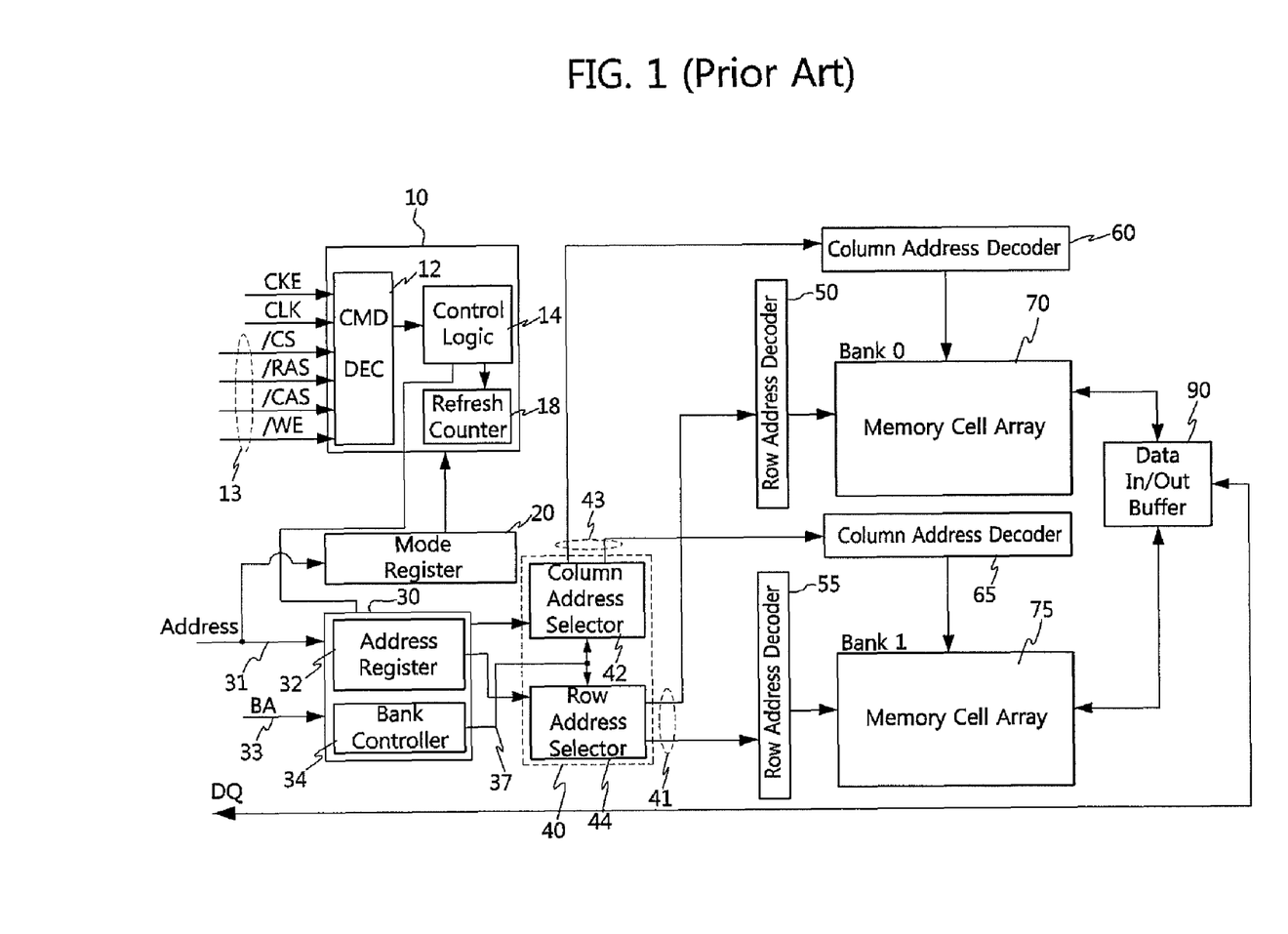
FIG. 1 is a schematic block diagram of a conventional synchronous dynamic random access memory (SDRAM)

FIG. 1 is a schematic block diagram of a conventional synchronous dynamic random access memory ("SRAM").

An SDRAM includes a plurality of memory banks in a core area of the SDRAM. In FIG. 1, the SDRAM includes, for example, two memory banks Bank 0 70 and Bank 1 75. Each memory bank includes a plurality of memory cells, each connected between one of a plurality of bit lines BL and one of a plurality of word lines WL.

The SDRAM includes a controller 10, a mode register 20, an address buffer 30, a bank selector 40, row address decoders 50 and 55, column address decoders 60 and 65, and a data input/output buffer 90 in a peripheral area of the SDRAM.

The controller 10 includes a command decoder 12, a refresh counter 18, and a control logic 14. The command decoder 12 receives: a clock signal CLK; a clock enable signal CKE; and a control signal 13, such as a chip enable signal /CS, a row address strobe signal /RAS, a column address strobe signal /CAS, a write enable signal /WE, and the like, from an external memory controller (not shown), and generates various commands including an activation command, a read command, a write command, an auto-refresh command, and a power-down command. The control logic 14 controls operation modes of the SDRAM according to data (e.g., CAS latency, burst type, and burst length) from the mode register 20 for controlling the SDRAM operation modes and the commands for controlling the SDRAM operation modes. The refresh counter 18 controls a refresh operation of DRAM cells in the memory cell arrays under control of the control logic 14.

The address buffer 30 includes an address register 32 and a bank controller 34.

The address register 32 receives and latches an address 31, and outputs a row address, a column address, and bank information at a given timing in response to the activation command, the read command, the write command, and the auto-refresh command.

The bank controller 34 generates bank select signals based on the bank information (BA) 33 and controls the row address decoder of the selected one of the plurality of banks to perform operation in response to the row address and the column address decoder of the selected one of the plurality of banks to perform operation in response to the column address.

A column address selector 42 provides the column address to the column address decoder of the bank selected by the bank select signal 37. A row address selector 44 provides the row address to the row address decoder of the bank selected by the bank select signal 37.

The SDRAM may include a row address decoder and a column address decoder for each memory bank. The row address decoders 50 and 55 decode the row address 41 to activate one of the plurality of word lines of the banks 70 and 75. The column address decoders 60 and 65 decode the column address 43 to activate one of the plurality of bit lines of the banks 70 and 75.

Charges of a memory cell connected with the activated word lines are carried on a corresponding bit line pair BL and BL/, and a difference in voltage between bit line pairs is sensed and amplified by a bit-line sense amplifier (not shown). After a predetermined time lapses, data developed on the bit line pair activated by the column address decoder is output to an I/O line pair and then to an I/O sense amplifier (not shown) and the input/output buffer 90.

When the read command is activated, the data input/output buffer 90 reads data (DQ) from the memory cell array and supplies the data (DQ) to an external data bus. When the write command is activated, the data input/output buffer 90 receives data (DQ) from the external data bus and supplies the data (DQ) to the memory cell array.

Inter-bank self-copy is not supported by a conventional SDRAM. Accordingly, an external processor should directly access the SDRAM to read data from a specific bank of the SDRAM and write the read data to another bank of the SDRAM. During the external processor accesses the SDRAM, the external processor cannot perform other operations, resulting in low operation speed and low operation performance.

In particular, for the purpose of multitasking, when a dual-core CPU having first and second processors mounted on one die accesses, via one port, a conventional single-port SDRAM without self-copy function, e.g., when an MPEG4 engine in the processor is allowed to access a specific memory area, the processor having the MPEG4 engine should directly access the SDRAM to read data and write the data to the specific memory area and then the MPEG4 engine should access the specific memory area. Thus, the processor having the MPEG4 engine is not able to perform other operations while the processor accesses the data, thereby degrading operation performance of the processor.

A conventional dual-port SDRAM includes a first local memory area dedicated to the first processor, a second local memory area dedicated to the second processor, and a shared memory area shared by the first and second processors. The conventional dual-port SDRAM further includes a hardware semaphore for controlling the first processor and the second processor to access the shared memory area without a collision. When an authority for accessing the shared memory area is changed, the hardware semaphore informs the first processor and the second processor of the authority change using a ready signal. In this case, the first and second processors read and write specific data from and to the hardware semaphore in order to access the shared memory area, causing overhead in accessing the shared memory area.

Inter-bank self-copy is not supported by a conventional dual-port SDRAM. Accordingly, when the conventional dual-port SDRAM is applied to a mobile communication terminal having a baseband processor and an application processor, the application processor should access the shared memory area every time when the data written to the shared memory area by the baseband processor need to be read several times by the application processor. This causes overhead in occupying the hardware semaphore, thereby degrading overall performance.

DISCLOSURE OF INVENTION

Technical Problem

It is a feature of the present invention to provide a memory device with a self-copy function.

It is another feature of the present invention to provide a memory system having the memory device with a self-copy function.

It is still another feature of the present invention to provide a dual-port memory device with a self-copy function.

Technical Solution

According to an aspect of the present invention for achieving the first feature, a memory device performing a self-copy operation includes: a memory cell array having first and second banks; and a memory interface configured to read data from a memory area of the first bank corresponding to a source address contained in previously set self-copy information and configured to write the read data to a memory area of the second bank corresponding to a destination address contained in the self-copy information via a self-copy data path when a self-copy signal is activated by an external self-copy start request. The memory interface may store the self-copy information in a predetermined area of the memory cell array in response to an external request for self-copy setting. The self-copy information may further include a data size. The self-copy information may further include a flag value indicating self-copy start, self-copy end, and a self-copy operation state, the flag value being updated by the memory interface monitoring the self-copy operation. The memory interface may include: a controller configured to output the source address and the destination address based on the self-copy information and configured to activate the self-copy signal in response to the self-copy start request; a self-copy selection circuit configured to select the source address and the destination address outputted from the controller when the self-copy signal is activated to output the selected source address and destination address; and a data input/output buffer configured to provide a self-copy data path when the self-copy signal is activated, the data input/output buffer reading the data from the memory area of the first bank corresponding to the source address and writing the read data to the memory area of the second bank corresponding to the destination address through the self-copy data path when the self-copy signal is activated. The controller may cyclically monitor the flag value indicating the self-copy start, the self-copy end, and the self-copy operation state. The self-copy selection circuit may include a plurality of switching circuits that select the source address and the destination address outputted from the controller to output the selected source address and destination address when the self-copy signal is activated and select an external input address to output the selected external input address when the self-copy signal is inactivated. The data input/output buffer may include: a data-path selecting circuit configured to provide a normal read/write data path for a bank selected by a bank select signal when the self-copy signal is inactivated, and provide the self-copy data path when the self-copy signal is activated, the data-path selecting circuit reading the data from the memory area of the first bank corresponding to the source address and writing the read data to the memory area of the second bank corresponding to the destination address through the self-copy data path when the self-copy signal is activated; a data output buffer configured to output data received from a memory cell array of the bank selected by the bank select signal via the read data path to an external data bus in a read operation; and a data input buffer configured to receive data from the external data bus and configured to provide the received data to the memory cell array selected by the bank select signal via the write data path in a write operation. The memory interface may include a synchronous DRAM interface. The memory device may include a single-port memory device.

According to an aspect of the present invention for achieving the second feature, a memory system includes a memory controller configured to provide a self-copy setting request including self-copy information and address information having an address indicating an area for storing the self-copy information, and a self-copy start request, the self-copy information including a source address, a destination address, and a flag value indicating a self-copy operation state; and a memory device configured to store the self-copy information in a predetermined area of a memory cell array in response to the self-copy setting request, wherein the memory device includes: a memory cell array having first and second banks; and a memory interface configured to read data from a memory area of the first bank corresponding to the source address contained in the self-copy information and configured to write the read data to a memory area of the second bank corresponding to the destination address contained in the self-copy information via a self-copy data path when a self-copy signal is activated by the self-copy start request.

According to an aspect of the present invention for achieving the third feature, a dual-port memory device includes: a memory cell array including first and second banks; a first memory interface coupled to a first processor via a first memory controller through a first port, for accessing the first bank to perform read and write operation; and a second memory interface coupled to a second processor via a second memory controller through a second port, for accessing the second bank to perform read and write operation, wherein the second memory interface reads data from a memory area of the first bank corresponding to a source address contained in previously set self-copy information and writes the read data to a memory area of the second bank corresponding to a destination address contained in the self-copy information via a self-copy data path when a self-copy signal is activated by a self-copy start request from the second memory controller. The dual-port memory device may further include a semaphore controller configured to control the first processor and the second processor to access the first bank without a collision. The second memory interface may store the self-copy information in a predetermined area of the memory cell array in response to a self-copy setting request from the second processor.

Advantageous Effects

The dual-port memory device with a self-copy function may be used in a mobile communication terminal having a baseband processor and an application processor. When the application processor needs to read, several times, data written by the baseband processor from the shared memory area, the dual-port memory device reads the data from the shared memory area and copies the read data to a local memory area dedicated to the application processor. Therefore, the application processor can perform other operations when the memory device is performing the self-copy operation, thereby improving operation performance of the application processor.

MODE FOR THE INVENTION

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. Like numbers refer to like elements throughout the specification.

While such terms as "first" and "second," etc., may be used to describe various components, such components must not be limited to the above terms. The above terms are used only to distinguish one component from another. For example, a first component may be referred to as a second component without departing from the scope of rights of the present invention, and likewise a second component may be referred to as a first component. The term "and/or" encompasses both combinations of the plurality of related items disclosed and any item from among the plurality of related items disclosed.

When a component is said to be "connected" to or "accessing" another component, this may mean that it is directly connected to or accessing the other component, but it is to be understood that another component may exist in-between. On the other hand, when a component is said to be "directly connected" to or "directly accessing" another component, it is to be understood that there are no other components in-between.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Similar reference numbers were used for similar components in the accompanying drawings Embodiments of the present invention will be described below in detail with reference to the accompanying drawings, wherein, when like components or components in correspondence with each other are assigned the same reference number, regardless of the FIG. number, repeated explanations are omitted.

Figure 2:
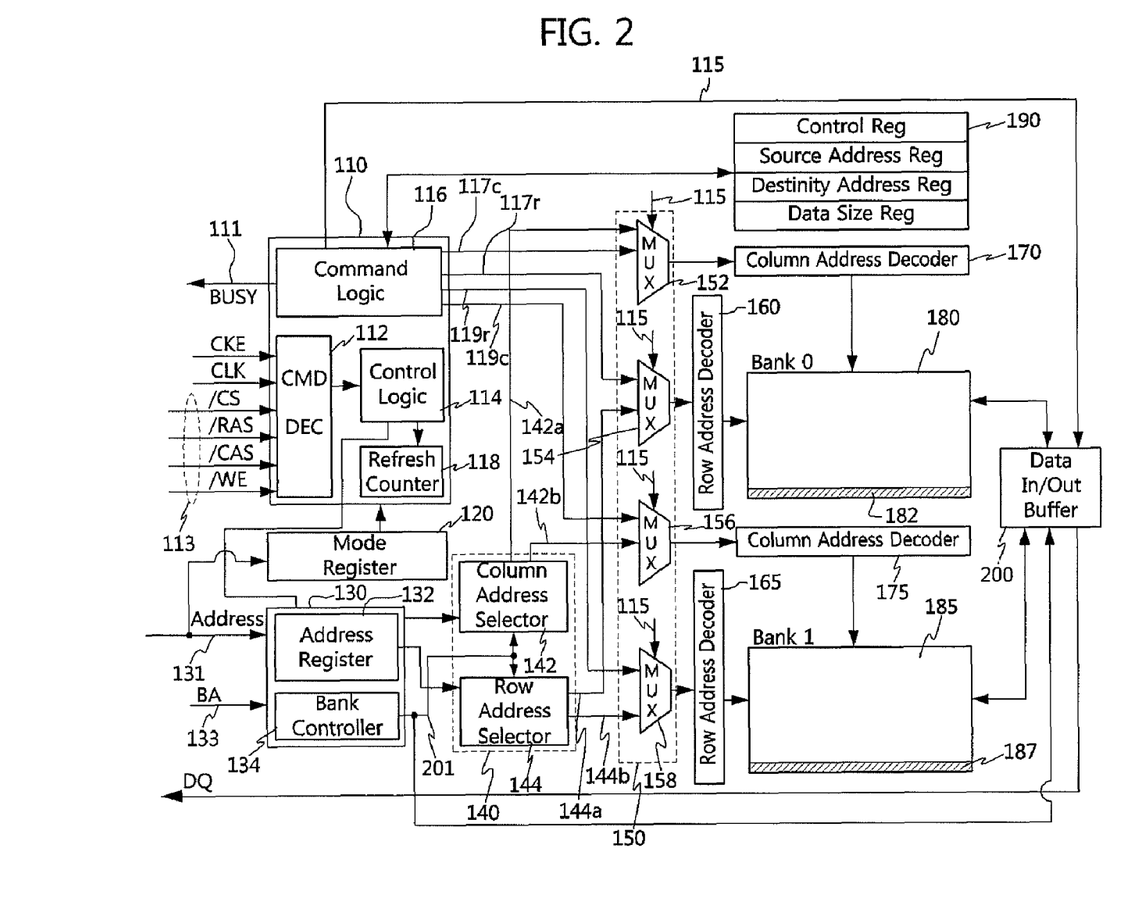
FIG. 2 is a block diagram schematically illustrating an internal configuration of an SDRAM according to an example embodiment of the present invention.
Figure 6:
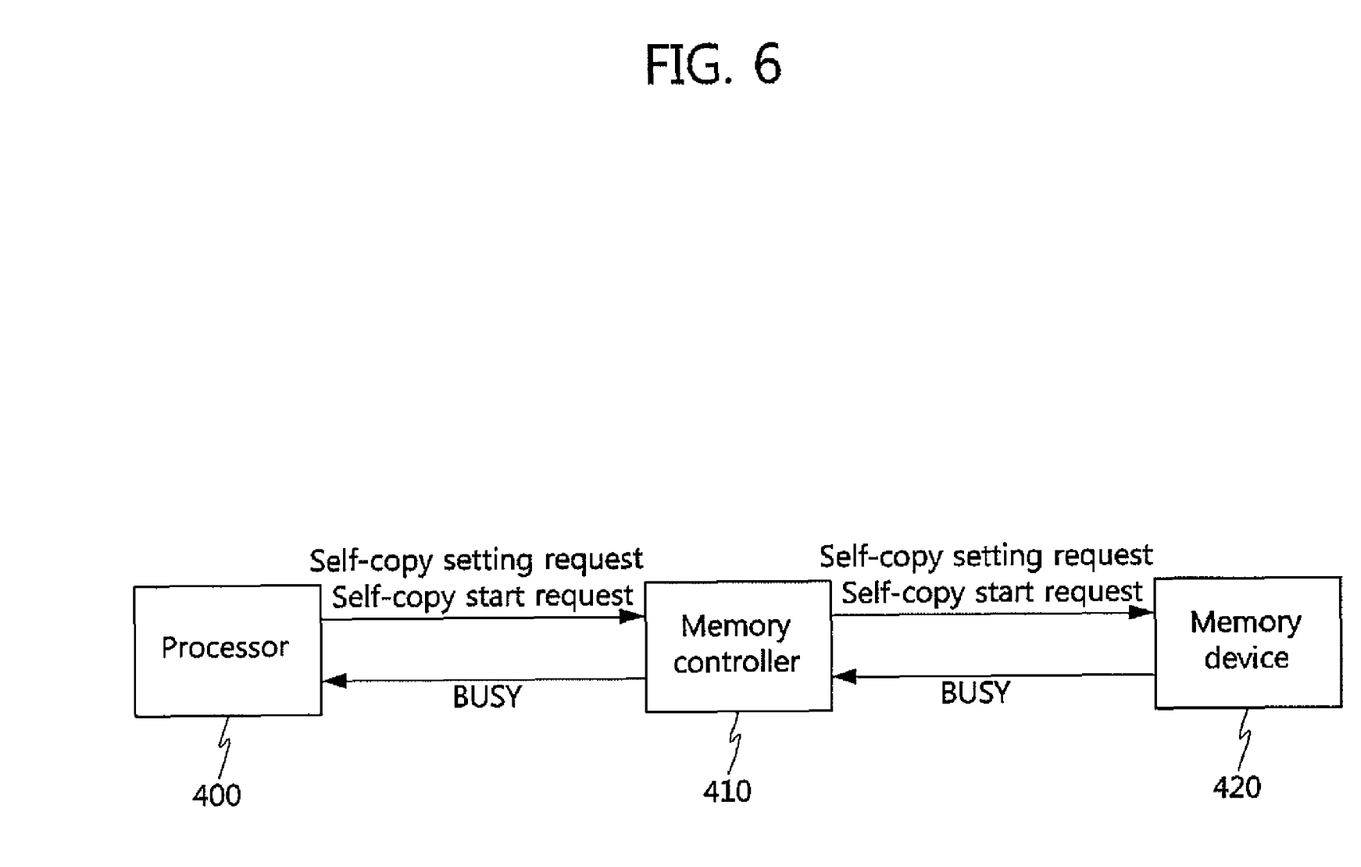
FIG. 6 is a block diagram illustrating a processor, a memory controller, and a memory device in order to explain a self-copy operation according to an example embodiment of the present invention.

FIG. 2 is a block diagram schematically illustrating an internal configuration of a synchronous DRAM ("SDRAM") according to an example embodiment of the present invention. FIG. 6 is a block diagram illustrating a processor, a memory controller, and a memory device in order to explain a self-copy operation according to an example embodiment of the present invention.

Referring to FIG. 6, a memory controller 410 receives from a processor 400 a self-copy setting request to request register setting for a self-copy operation, and sends the self-copy setting request to a memory device 420.

Specifically, the memory controller 410 provides a write signal that is a combination of /CS, /RAS, /CAS and /WE (e.g., low /CS, low /WE, low /RAS and high /CAS) to the memory device 420 via a control-signal bus in order to make a request for self-copy setting. The memory controller 410 also provides address information having an address indicating an area for storing self-copy information to the memory device 420 via an address bus. The memory controller 410 also provides self-copy information to the memory device 420 via a data bus. In a write operation, the memory device 420 performs register setting for a self-copy operation. The address information having an address indicating an area for storing the self-copy information may indicate an uppermost address area in a predetermined bank of the memory device 420.

The self-copy information may include self-copy control data, and a source address of a source bank and a destination address of a destination bank for self copy. The self-copy information may further include a size of data to be self copied. Here, the data size may be fixed or may vary with the self-copy operation.

The source address includes source bank information indicating a source bank, a source row address, and a source column address, and the destination address includes destination bank information indicating a destination bank, a destination row address, and a destination column address. The self-copy control data may include a flag indicating self-copy start, self-copy end, and/or a self-copy operation state.

In response to the self-copy setting request, the memory device 420 performs register setting for a self-copy operation by storing the self-copy information in a predetermined address area of a predetermined bank of the memory device 420 or a predetermined register. For example, the predetermined address area may be an uppermost address area of the predetermined bank.

When the self-copy operation is required, the memory controller 410 receives a self-copy start request from the processor 400 and sends the self-copy start request to the memory device 420.

In response to the self-copy start request, the memory device 420 sets the flag indicating self-copy start previously stored in the predetermined address area of the predetermined bank or the predetermined register to indicate the self-copy start.

The memory device 420 performs the self-copy operation based on such self-copy information while cyclically monitoring the flag value indicating self-copy start, self-copy end and/or a self-copy operation state.

The memory device 420 outputs to the memory controller 410 a busy signal indicating whether the self-copy operation is being performed or is completed.

When the busy signal is activated, the memory controller 410 and the processor 400 may recognize that the self-copy operation is being performed. When the busy signal is inactivated, the memory controller 410 and the processor 400 may recognize that the self-copy operation is completed. Alternatively, the memory controller 410 and the processor 400 may directly read the register value from the predetermined address area of the predetermined bank of the memory device 420 or the predetermined register to determine whether the self-copy operation is being performed or is completed.

Hereinafter, the self-copy operation in the memory device will now be described. It is assumed that the memory device 420 is, for example, an SDRAM.

The SDRAM includes a plurality of memory banks in a core area. Each memory bank includes a plurality of memory cells, each connected between one of a plurality of bit lines BL and one of a plurality of word lines WL. In FIG. 2, the SDRAM includes, for example, two memory banks Bank 0 180 and Bank 1 185.

The SDRAM includes a memory interface disposed in a peripheral area for performing data read, write, refresh and self-copy operations with the plurality of memory cells. The memory interface includes a controller 110, a mode register 120, an address buffer 130, a bank selector 140, a self-copy selection circuit 150, row address decoders 160 and 165, column address decoders 170 and 175, and a data input/output buffer 200.

Data (e.g., CAS Latency, burst type, and burst length) for controlling various operation modes of the SDRAM are programmed and stored in the mode register 120.

The Controller 110 may include a command decoder 112, a control logic 114, a command logic 116, and a refresh counter 118. Although, in FIG. 2, the refresh counter 118 is included in the controller 110, the refresh counter 118 may be implemented separately from the controller 110.

The command decoder 112 receives a clock signal CLK, a clock enable signal CKE, and a control signal 113, such as a chip enable signal /CS, a row address strobe signal /RAS, a column address strobe signal /CAS, a write enable signal /WE, from the external memory controller 410 (FIG. 6), and generates commands for controlling the operation modes of the SDRAM, such as an activation command, a read command, a write command, an auto refresh command, and a power-down command.

The control logic 114 controls operation modes of the SDRAM according to the data (e.g., CAS Latency, burst type, and burst length) from the mode register 120 for controlling the SDRAM operation modes and the commands for controlling the operation modes of the SDRAM.

The refresh counter 118 controls a refresh operation of the DRAM cells in the memory cell array under control of the control logic 114.

The command logic 116 controls an inter-bank self-copy operation based on the self-copy information stored in the predetermined address area of the predetermined bank or in the predetermined register according to an example embodiment of the present invention.

The command logic 116 controls the self-copy operation based on the self-copy information while cyclically monitoring the flag value indicating self-copy start, self-copy end and/or a self-copy operation state.

When the self-copy operation is initiated, the command logic 116 provides a source address of a source bank and a destination address of a destination bank to the self-copy selection circuit 150.

The command logic 116 may update the flag value indicating a self-copy operation state contained in the self-copy information to reflect self-copy start, self-copy end, and a self-copy operation state to the self-copy information in the self-copy operation.

When the self-copy operation is being performed based on the flag value indicating a self-copy operation state contained in the self-copy information, the command logic 116 also activate a self-copy signal 115 and outputs the same. Here, the self-copy signal 115 may or may not be a busy signal (BUSY) 111.

The self-copy information may be stored in an upper address area 182 or 187 of the predetermined bank. In this case, a self-copy control register 190 shown in FIG. 2 is not a separate register but a conceptual representation of the upper address area 182 or 187 of the predetermined bank. Alternatively, the self-copy control register may be a separate register configured to store the self-copy information.

Upon receipt of a register setting request for a self-copy operation from a host, e.g., the processor 400 (FIG. 6), the external memory controller 410 (FIG. 6) provides address information about an uppermost address area of a specific bank and the self-copy information to the SDRAM memory device. In a normal write operation, the SDRAM memory device can perform register setting for a self-copy operation by writing the self-copy information to the uppermost address area of the specific bank indicated by the address information.

When the self-copy operation is completed, the command logic 116 inactivates the busy signal (BUSY) 111 and provides the inactivated busy signal (BUSY) 111 to the memory controller 410. For example, the activated busy signal (BUSY) 111 indicates that the self-copy operation is being performed, and the inactivated busy signal (BUSY) 111 may be a self-copy end signal indicating that the self-copy operation is completed.

Although, in FIG. 2, the control logic 114 and the command logic 116 are shown as separate blocks, the control logic 114 and the command logic 116 may be implemented by one block with the same function as the function of the control logic 114 and the command logic 116 implemented as two separate blocks.

The self-copy selection circuit 150 may include first, second, third, and fourth switching circuits 152, 154, 156, and 158. Each switching circuit may be implemented, for example, by a multiplexer.

When the self-copy signal 115 is activated, the first switching circuit 152 provides a row address 117r provided from the command logic 110 to the row address decoder 160 for bank 0 and a column address 117c provided from the command logic 110 to the column address decoder 170 for bank 0.

When the self-copy signal 115 is activated, the first switching circuit 152 provides the row address 117r provided from the command logic 110 to the row address decoder 160 for bank 0.

When the self-copy signal 115 is activated, the second switching circuit 154 provides the column address 117c provided from the command logic 110 to the column address decoder 170 for bank 0.

When the self-copy signal 115 is activated, the third switching circuit 156 provides a row address 119r provided from the command logic 110 to the row address decoder 165 for bank 1.

When the self-copy signal 115 is activated, the fourth switching circuit 158 provides a column address 119c provided from the command logic 110 to the column address decoder 175 of bank 1.

When the self-copy signal 115 is inactivated, the first, second, third and fourth switching circuits 152, 154, 156, and 158 select the column address and the row address provided from the column address selector 142 and the row address selector 144 and provide the column address and the row address to the column address decoder and the row address decoder.

The self-copy signal 115 may be provided from the command logic 110 and activated when the flag indicating a self-copy operation state is activated.

The address buffer 130 may include an address register 132 and a bank controller 134.

The address register 132 receives an address 131 and bank information (BA) 133, and outputs the row address, the column address, and the bank information at a given timing in response to the activation command, the read command, the write command, and the auto-refresh command.

The bank controller 134 generates a bank select signal 201 indicating one of a plurality of banks based on the bank information (BA) 133 provided from the address register 132, and controls a row address decoder connected to the selected bank of the plurality of banks to decode a row address and a column address decoder connected to the selected bank of the plurality of banks to decode a column address.

The bank controller 134 may provide the bank select signal 201 to the column address selector 142 and the row address selector 144, as shown in FIG. 2. In FIG. 2, the bank controller 134 is shown as being included in the address buffer 130 for providing the bank select signal 201 to the column address selector 142 and the row address selector 144. In other example embodiments of the present invention, the bank controller 134 may be implemented externally with respect to the address buffer 130 to directly provide the bank select signal 201 to the row address decoder and the column address decoder of each bank.

The bank selector 140 includes the column address selector 142 and the row address selector 144.

The column address selector 142 provides the column address to the column address decoder of the bank that is selected based on the bank select signal 201.

The row address selector 144 provides the row address (144a, 144b) to the row address decoder connected to the bank that is selected based on the bank select signal 201.

The row address decoder circuit includes row address decoders 160 and 165 respectively disposed in the banks.

Each row address decoder decodes the row address provided from the self-copy selection circuit 150 to activate one of a plurality of word lines of the corresponding bank.

The column address decoder circuit includes column address decoders and 170 and 175 respectively disposed in the banks.

Each column address decoder decodes the column address provided from the self-copy selection circuit 150 to activate one of a plurality of bit lines of the corresponding bank.

Charges from memory cells coupled to the activated word lines are carried onto a corresponding bit line pair BL and BL/, and a difference in voltage between bit line pairs is sensed and amplified by a bit-line sense amplifier (not shown). After a predetermined time lapses, data developed on the bit line pair activated by the column address decoder is provided to an I/O line pair and then outputted through an I/O sense amplifier (not shown) and the input/output buffer 200.

Figure 3:
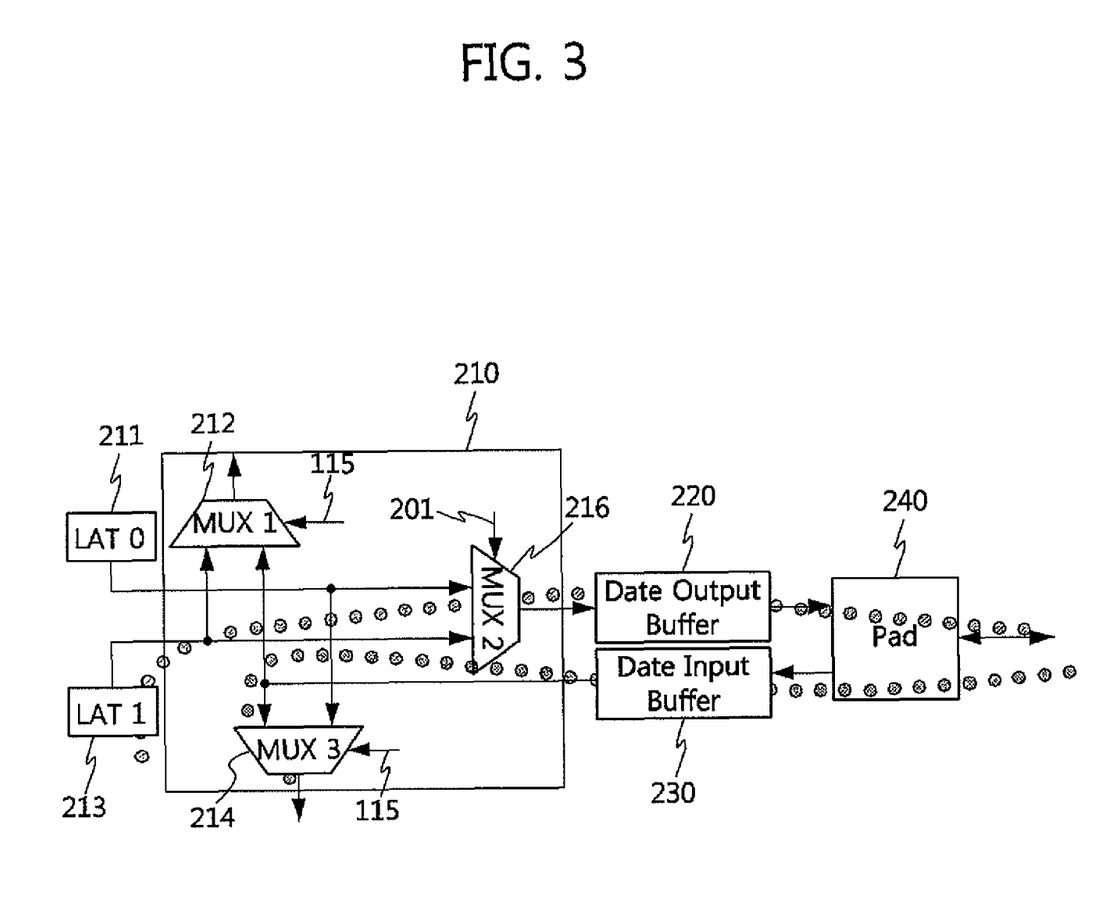
FIG. 3 is a block diagram illustrating a normal data read/write operation via bank 1 according to an example embodiment of the present invention.

Referring to FIGS. 2 and 3, the data input/output buffer 200 includes a data-path selecting circuit 210, a data output buffer 220, and a data input buffer 230. The data input/output buffer 200 may further include data latches 211 and 213 disposed in a previous stage of the data-path selecting circuit 210 for latching input/output data.

The data-path selecting circuit 210 includes a plurality of switching circuits 212, 214, and 216. When the self-copy signal 115 is inactivated, the data-path selecting circuit 210 provides a normal read/write data path for the bank selected by the bank select signal 201. When the self-copy signal 115 is activated, the data-path selecting circuit 210 provides a self-copy data path to read data from a memory area of bank 0 corresponding to the source address and write the read data to a memory area of bank 1 corresponding to the destination address. For example, each switching circuit may be implemented by a multiplexer.

In a normal read operation, when the read command is activated, the data output buffer 220 receives the data from the memory cell array of the bank selected by the bank select signal 201 via the normal read data path, and supplies the data to the external data bus.

In a normal write operation, when the write command is activated, the data input buffer 230 receives data from the external data bus and supplies the data to the memory cell array selected by the bank select signal 201 via the normal write data path.

FIG. 3 is a block diagram illustrating a normal data read/write operation via bank 1 according to an example embodiment of the present invention.

Referring to FIG. 3, in a read operation, when the self-copy signal 115 is inactivated and the bank select signal 201 indicates bank 1, data read from the memory cell array of selected bank 1 is output to the external data bus via a normal read data path including the data latch 213, the second multiplexer 216, the data output buffer 220, and a pad 240. Here, when the data latch 213 is not included, the data read from the memory cell array is output to the external data bus via the second multiplexer 216, the data output buffer 220 and the pad 240.

In a write operation, when the self-copy signal is inactivated and the bank select signal 201 indicates bank 1, data (DQ) input from the external data bus is written to the memory cell array of the selected bank 1 via the normal write data path including the pad 240, the data input buffer 230 and a third multiplexer 214.

Figure 4:
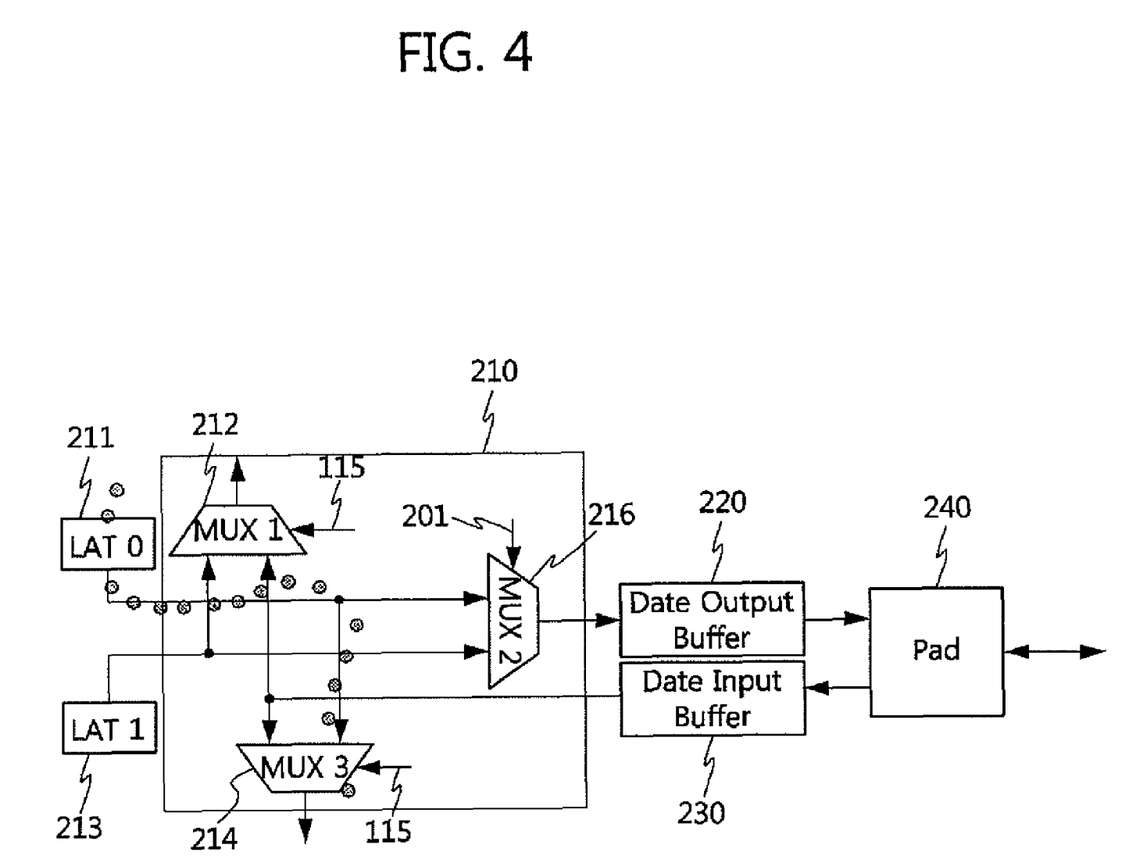
FIG. 4 is a block diagram illustrating a self-copy operation from bank 0 to bank 1 in a data input/output buffer of FIG. 2.

FIG. 4 is a block diagram illustrating a self-copy operation from bank 0 to bank 1 in the data input/output buffer of FIG. 2. In FIG. 4, the source address contained in the self-copy information indicates an address of bank 0 and the destination address indicates an address of bank 1.

Referring to FIG. 4, data read from the memory cell array of bank 0 is written to the memory cell array of bank 1 via a self-copy data path including an I/O sense amplifier (not shown), a data latch 211, and a third multiplexer 214. In this case, a second multiplexer 216 is inactivated so that a data input/output operation via a data input buffer 220 and a data output buffer 230 does not occur, and the data read from the memory cell array of bank 0 is directly written to the memory cell array of bank 1 via the I/O sense amplifier, the data latch 211, and the third multiplexer 214. Here, when the data latch 211 is not included, the data read from the memory cell array of bank 0 is directly written to the memory cell array of bank 1 via the I/O sense amplifier and the third multiplexer 214.

Figure 5:
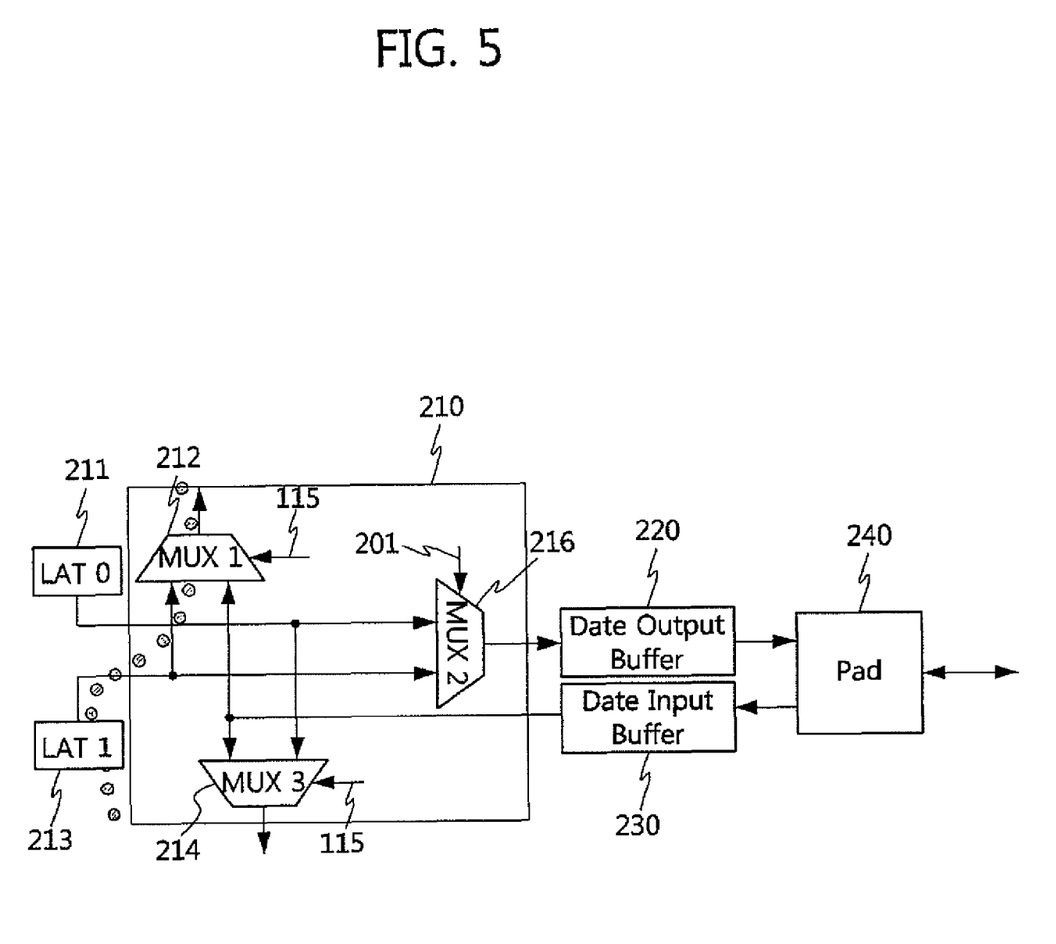
FIG. 5 is a block diagram illustrating a self-copy operation from bank 1 to bank 0 in the data input/output buffer of FIG. 2.

FIG. 5 is a block diagram illustrating a self-copy operation from bank 1 to bank 0 in the data input/output buffer of FIG. 2. In FIG. 5, the source address contained in the self-copy information indicates an address of bank 1 and the destination address indicates an address of bank 0.

Referring to FIG. 5, data read from the memory cell array of bank 1 is written to the memory cell array of bank 0 via a self-copy data path including an I/O sense amplifier (not shown), a data latch 213, and a first multiplexer 212. In this case, a second multiplexer 216 is inactivated so that a data input/output operation via a data input buffer 220 and a data output buffer 230 does not occur, and the data read from the memory cell array of bank 1 is directly written to the memory cell array of bank 0 via the I/O sense amplifier, the data latch 213, and the first multiplexer 212. Here, when the data latch 211 is not included, the data read from the memory cell array of bank 1 is directly written to the memory cell array of bank 0 via the I/O sense amplifier and the first multiplexer 212.

Figure 7:
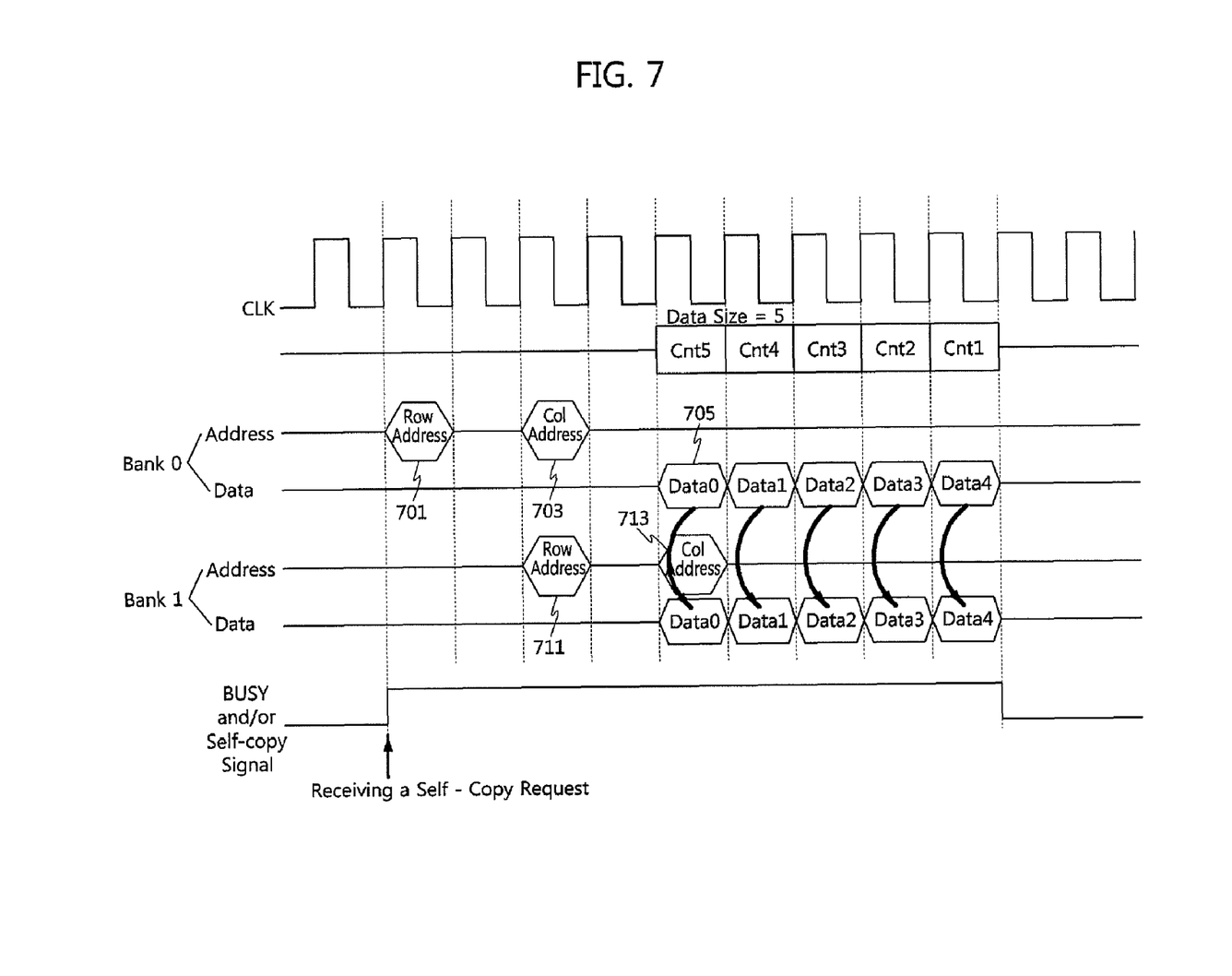
FIG. 7 is a timing diagram illustrating a self-copy operation according to an example embodiment of the present invention.

FIG. 7 is a timing diagram illustrating a self-copy operation according to an example embodiment of the present invention. In FIG. 7, the source address contained in the self-copy information indicates an address of bank 0, the destination address indicates an address of bank 1, and a data size is 5.

Referring to FIG. 7, when a self-copy start request is received from the memory controller 410 a busy and/or a self-copy signal is activated. And, the SDRAM memory device reads the previously set register value for a self-copy operation, i.e., the self-copy information, and provides a row address 701 contained in the source address to the row address decoder 160 via the second switching circuit 154 and a column address 703 to the column address decoder 170 via the first switching circuit 152. After a predetermined delay time lapses, read data 705 corresponding to the data size (Cnt 5, Cnt 4, Cnt 3, Cnt2 and Cnt1), i.e., Data 0, Data 1, Data 2, Data 3, and Data 4, are output from a memory cell corresponding to the row address 701 and the column address 703 to the I/O sense amplifier. Here, the number of the output data 705 may be controlled by a counter circuit in the command logic 110 performing a counting operation based on the data size information.

Meanwhile, a row address 711 of the destination address for self copy is provided to the row address decoder 165 via the fourth switching circuit 158, and a column address 713 is provided to the column address decoder 175 via the third switching circuit 156. The read data 705 read from the source address is written to a memory cell corresponding to the row address 711 and the column address 713. Here, when the read data 705 are output to the I/O sense amplifier and then written to the memory cell corresponding to the row address 711 and the column address 713, the read data 705 do not pass through the data input buffer and the data output buffer. Accordingly, there is a delay through a combinational logic circuit, such as the multiplexers of FIG. 4.

For the purpose of multitasking, when a dual-core CPU having first and second processors mounted on one die accesses, via one port, a conventional single-port SDRAM without a self-copy function, e.g., when an MPEG4 engine in the processor is allowed to access a specific memory area, the processor should directly access the SDRAM to read data and write the data to the specific memory area and then the MPEG4 engine should access the specific area. Thus, the processor is not able to perform other operations while the processor accesses the data, thereby degrading operation performance of the processor.

However, in the single-port SDRAM with a self-copy function according to the example embodiments of the present invention, specific location information is stored in a predetermined area of the memory or in a separate register in advance. And, the SDRAM itself copies data to a memory area corresponding to such the specific location of the specific location information, without the processor's intervention. Accordingly, during the self-copy operation, the processor is allowed to perform other operations. Because load of the processor is reduced, the operation speed and operation performance of the processor can be improved.

Figure 8:
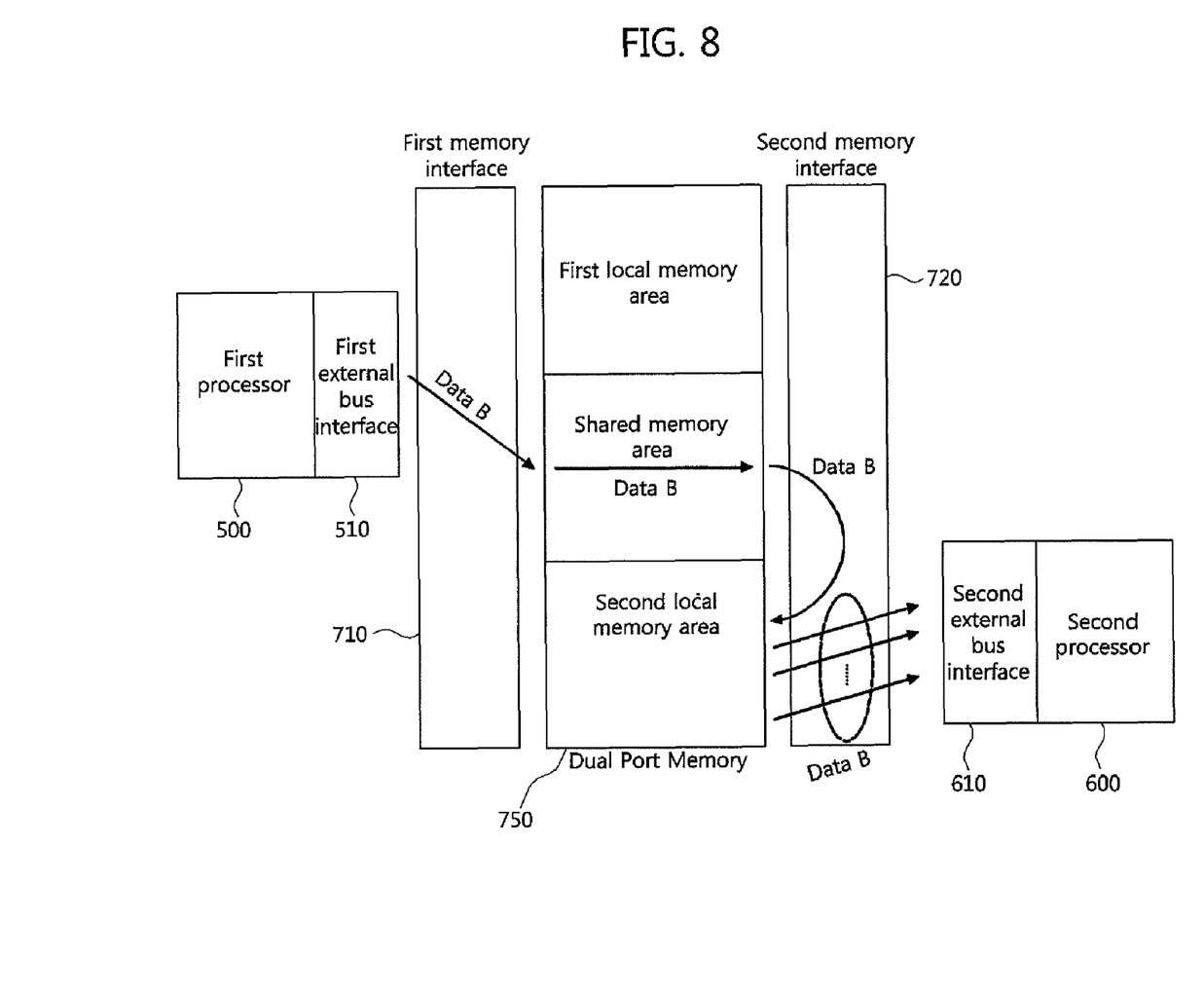
FIG. 8 is a schematic block diagram illustrating a self-copy operation in a dual-port memory device with a self-copy function according to another example embodiment of the present invention.

FIG. 8 is a schematic block diagram illustrating a self-copy operation in a dual-port memory device with a self-copy function according to another example embodiment of the present invention.

Referring to FIG. 8, the memory system according to another example embodiment of the present invention includes a first processor 500, a second processor 600, and a dual-port memory 750.

The dual-port memory 750 is coupled to the first processor 500 via a first external bus interface (EBI) 510 through a port A, and to the second processor 600 via a second external bus interface 610 through a port B.

The first external bus interface 510 and the second external bus interface 610 serve as a kind of memory controllers.

A memory cell array of the dual-port memory 750 includes a first local memory area, a second local memory area and a shared memory area. When the dual-port memory 750 is a dual-port SDRAM, the memory cell array includes four banks. For example, one of the banks may be allocated to the first local memory area, two may be allocated to the second local memory area, and one may be allocated to the shared memory area.

Although not shown in FIG. 8, the dual-port memory 750 may further include a semaphore controller for controlling the first processor 500 and the second processor 600 to access the shared memory area without a collision. The semaphore controller may be coupled with a first memory interface 710, a second memory interface 720, the first processor 500, and the second processor 600 for informing the first processor 500 and the second processor 600 of authority change when a authority to access the shared memory area is changed.

The second memory interface 720 performs a self-copy operation and has the same structure as the memory interface included in the peripheral area of FIG. 2 according to an example embodiment of the present invention. The shared memory area of FIG. 8 corresponds to bank 0 of FIG. 2, and the second local memory area of FIG. 8 corresponds to bank 1 of FIG. 2. Meanwhile, the first memory interface 710 may perform the self-copy operation and have the same structure as the memory interface included in the peripheral area of FIG. 2.

For a mobile communication terminal, the first processor 500 is a baseband processor that performs a write operation, and the second processor 600 is an application processor, such as a video processor or a multimedia processor that executes an application program. The second processor 600 frequently refer to the data stored in the memory cell array of the dual-port memory 700. Accordingly, the second processor 600 may read frequently the data stored in the shared memory area written by the first processor 500.

When the second processor 600 needs to read, at least once, data B stored in the shared memory area written by the first processor 500, the second processor 600 provides a self-copy start request to the dual-port memory 750 via the second external bus interface 610, performs a self-copy operation to read data B from the shared memory area, and copies the read data B to the second local memory area.

When the second processor 600 reads and uses frequently the data stored in the shared memory area written by the first processor 500, a direct memory access (DMA) of the second processor 600 may determine whether to copy the data to the second local memory area. Alternatively, a central processing unit (not shown) in the second processor 600 may directly determine whether to copy the data to the second local memory area.

The second processor 600 can read the data, which has been written by the first processor 500 through the self-copy process, from the second local memory area dedicated to the second processor 600 without having to access the shared memory area.

Although the memory device has been described as the synchronous DRAM, the self-copy operation according to an example embodiment of the present invention may be implemented by a pseudo SRAM (PSRAM) and other semiconductor memory devices having a memory cell array including a plurality of banks. For example, when the memory device is a PSRAM, the PSRAM has substantially the same structure as the above-described synchronous DRAM except that control signals inputted from the memory controller include /CS, /WE, /OE (Output Enable), /WAIT, and the like, the bank address BA is inputted not separately but via an address pin, and the bank information is stored in an upper address.

While the invention has been shown and described with reference to certain example embodiments thereof, it will be understood by those skilled in the art that various changes in form and details may be made therein without departing from the spirit and scope of the invention as defined by the appended claims.

The invention claimed is:

1. A memory device performing a self-copy operation, comprising:
    a memory cell array having first and second banks; and
    a memory interface configured to read data from a memory area of the first bank corresponding to a source address contained in previously set self-copy information and configured to write the read data to a memory area of the second bank corresponding to a destination address contained in the self-copy information via a self-copy data path when a self-copy signal is activated by an external self-copy start request.

2. The memory device of claim 1, wherein the memory interface stores the self-copy information in a predetermined area of the memory cell array in response to an external request for self-copy setting.

3. The memory device of claim 1, wherein the self-copy information further comprises a data size.

4. The memory device of claim 1, wherein the self-copy information further comprises a flag value indicating self-copy start, self-copy end, and a self-copy operation state, the flag value being updated by the memory interface monitoring the self-copy operation.

5. The memory device of claim 4, wherein the memory interface comprises:
    a controller configured to output the source address and the destination address based on the self-copy information and configured to activate the self-copy signal in response to the self-copy start request;
    a self-copy selection circuit configured to select the source address and the destination address outputted from the controller when the self-copy signal is activated to output the selected source address and destination address; and
    a data input/output buffer configured to provide a self-copy data path when the self-copy signal is activated, the data input/output buffer reading the data from the memory area of the first bank corresponding to the source address and writing the read data to the memory area of the second bank corresponding to the destination address through the self-copy data path when the self-copy signal is activated.

6. The memory device of claim 5, wherein the controller cyclically monitors the flag value indicating the self-copy start, the self-copy end, and the self-copy operation state.

7. The memory device of claim 5, wherein the self-copy selection circuit comprises a plurality of switching circuits that select the source address and the destination address outputted from the controller to output the selected source address and destination address when the self-copy signal is activated and select an external input address to output the selected external input address when the self-copy signal is inactivated.

8. The memory device of claim 5, wherein the data input/output buffer comprises:
    a data-path selecting circuit configured to provide a normal read/write data path for a bank selected by a bank select signal when the self-copy signal is inactivated, and provide the self-copy data path when the self-copy signal is activated, the data-path selecting circuit reading the data from the memory area of the first bank corresponding to the source address and writing the read data to the memory area of the second bank corresponding to the destination address through the self-copy data path when the self-copy signal is activated;
    a data output buffer configured to output data received from a memory cell array of the bank selected by the bank select signal via the read data path to an external data bus in a read operation; and
    a data input buffer configured to receive data from the external data bus and configured to provide the received data to the memory cell array selected by the bank select signal via the write data path in a write operation.

9. The memory device of claim 1, wherein the memory interface includes a synchronous DRAM interface.

10. The memory device of claim 1, wherein the memory device includes a single-port memory device.

11. A memory system comprising:
    a memory controller configured to provide a self-copy setting request including self-copy information and address information having an address indicating an area for storing the self-copy information, and a self-copy start request, the self-copy information including a source address, a destination address, and a flag value indicating a self-copy operation state; and
    a memory device configured to store the self-copy information in a predetermined area of a memory cell array in response to the self-copy setting request,
    wherein the memory device comprises:
    a memory cell array having first and second banks; and
    a memory interface configured to read data from a memory area of the first bank corresponding to the source address contained in the self-copy information and configured to write the read data to a memory area of the second bank corresponding to the destination address contained in the self-copy information via a self-copy data path when a self-copy signal is activated by the self-copy start request.

12. The memory system of claim 11, wherein the memory device performs a self-copy operation based on the self-copy information while cyclically monitoring the flag value indicating the self-copy operation state.

13. A dual-port memory device comprising:
a memory cell array including first and second banks;
a first memory interface, coupled to a first processor via a first memory controller through a first port, for accessing the first bank to perform read and write operations; and
a second memory interface, coupled to a second processor via a second memory controller through a second port, for accessing the second bank to perform read and write operations,
wherein the second memory interface reads data from a memory area of the first bank corresponding to a source address contained in previously set self-copy information and writes the read data to a memory area of the second bank corresponding to a destination address contained in the self-copy information via a self-copy data path when a self-copy signal is activated by a self-copy start request from the second memory controller.

14. The dual-port memory device of claim 13, further comprising a semaphore controller configured to control the first processor and the second processor to access the first bank without a collision.

15. The dual-port memory device of claim 13, wherein the second memory interface stores the self-copy information in a predetermined area of the memory cell array in response to a self-copy setting request from the second processor.

16. The dual-port memory device of claim 13, wherein the self-copy information further comprises a data size.

17. The dual-port memory device of claim 13, wherein the self-copy information further comprises a flag value indicating self-copy start, self-copy end, and a self-copy operation state, the flag value being updated by the second memory interface monitoring the self-copy operation.

18. The dual-port memory device of claim 17, wherein the second memory interface comprises:
a controller configured to output the source address and the destination address based on the self-copy information and configured to activate the self-copy signal in response to the self-copy start request;
a self-copy selection circuit configured to select the source address and the destination address outputted from the controller to output the selected source address and destination address when the self-copy signal is activated; and
a data input/output buffer configured to provide the self-copy data path when the self-copy signal is activated, the data input/output buffer reading data from the memory area of the first bank corresponding to the source address and writing the read data to the memory area of the second bank corresponding to the destination address when the self-copy signal is activated.

19. The dual-port memory device of claim 18, wherein the self-copy selection circuit comprises a plurality of switching circuits configured to select the source address and the destination address outputted from the controller to output the selected source address and destination address when the self-copy signal is activated and configured to select an external input address to output the selected external input address when the self-copy signal is inactivated.

20. The dual-port memory device of claim 18, wherein the data input/output buffer comprises:
a data-path selecting circuit configured to provide a normal read/write data path for a bank selected by a bank select signal when the self-copy signal is inactivated, and provide the self-copy data path when the self-copy signal is activated, the data-path selecting circuit reading the data from the memory area of the first bank corresponding to the source address and writing the read data to the memory area of the second bank corresponding to the destination address through the self-copy data path when the self-copy signal is activated;
a data output buffer configured to output the data received from a memory cell array of the bank selected by the bank select signal via the read data path to an external data bus in a read operation; and
a data input buffer configured to receive data from the external data bus and supply the data to the memory cell array selected by the bank select signal via the write data path in a write operation.

* * * * *